United States Patent [19]

Helstern et al.

[11] Patent Number: 5,743,629
[45] Date of Patent: Apr. 28, 1998

[54] ILLUMINATION SYSTEM

[75] Inventors: Robert P. Helstern; Yusuke P. Okabayashi, both of Costa Mesa, Calif.

[73] Assignee: Eaton Corporation, Cleveland, Ohio

[21] Appl. No.: 698,307

[22] Filed: Aug. 15, 1996

[51] Int. Cl.6 .................................................. F21V 9/00
[52] U.S. Cl. ........................ 362/293; 362/347; 362/800; 313/512; 359/884
[58] Field of Search .......................... 313/512; 359/884; 362/293, 347, 800

[56] References Cited

U.S. PATENT DOCUMENTS

| | | |
|---|---|---|
| 1,966,059 | 7/1934 | Chiera . |
| 4,298,005 | 11/1981 | Mutzhas ............................ 128/396 |
| 4,385,344 | 5/1983 | Gosner ................................ 362/32 |
| 4,810,937 | 3/1989 | Havel ................................ 315/152 |
| 5,083,252 | 1/1992 | McGuire ............................ 362/293 |
| 5,144,540 | 9/1992 | Hayes ................................ 362/293 |
| 5,241,457 | 8/1993 | Sasajima et al. .................. 362/800 |

*Primary Examiner*—Carroll B. Dority
*Attorney, Agent, or Firm*—Tarolli, Sundheim, Covell, Tummino & Szabo

[57] ABSTRACT

An improved apparatus for illuminating a display, such as a lens, includes a source of nonwhite light of a first color at an energy level which can be perceived by the human eye. The nonwhite light of a first color is reflected from a reflector to obtain white light. In one embodiment of the invention, the nonwhite light source was a solid state device (light emitting diode) which produced blue light at a high-energy level and green and red light at relatively low energy levels with the result that the green and red light could not be perceived by a human eye simultaneously with the blue light. The light from the solid state light source was reflected from a reflector having a gold (yellow) reflecting surface. The light reflected from the reflecting surface interfered with light emitted directly form the solid state light source with a chromatic shift of light energy. The resulting light from the reflector was white light.

41 Claims, 4 Drawing Sheets

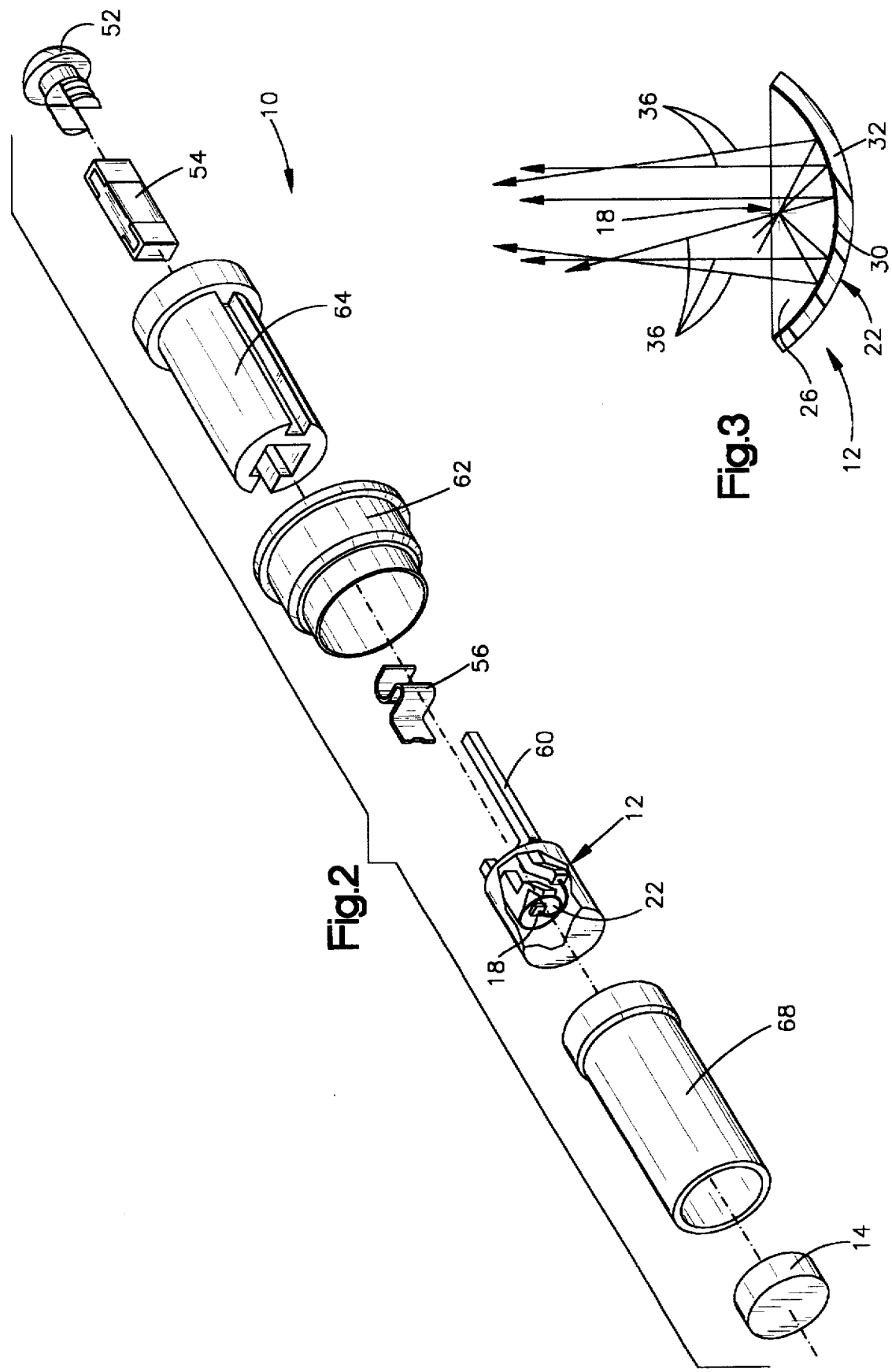

5,743,629

ILLUMINATION SYSTEM

BACKGROUND OF THE INVENTION

The present invention relates to a new and improved method and apparatus for providing illumination.

Light emitting diodes are an example of solid state types of light sources. Typically, solid state light sources emit light within a very narrow portion of the visible spectrum. This characteristic is normally understood as a highly saturated monochromatic light source emission with most of the spectral energy distributed around the peak wavelength emitted. It is this narrow spectral distribution that an observer perceives as the color of the light source.

It is know that under certain ambient temperatures, light emitting diodes have a propensity to change color due to the effects of increased temperature above the photo-semiconductor junction temperature tolerance during typical operation. The temperature can also increase due to changes in ambient temperature. The amount of change in the peak wavelength within the spectral bandwidth of a given light emitting diode can be as little as 5 nanometers to as much as 20 nanometers dependent upon the device's working environment. It has been established that as junction temperature rises, changes in the peak wavelength or perceived color of the light source has a tendency to shift to a longer wavelength value or color.

SUMMARY OF THE INVENTION

The present invention provides a new and improved method and apparatus for use in providing illumination. The illumination may, for example, be for a display, such as an annunciator or a pushbutton of a switch. The display may be provided on a control panel or may be in a different environment. Of course, this illumination may be for other purposes.

To provide the illumination, a light source is energized to produce nonwhite light of first color at an energy level which can be perceived by a human eye. In one specific embodiment of the invention, the light source was a solid state light source which was energized to produce blue light at an energy level at which the blue light could be perceived by a human eye. In addition to the nonwhite light of a first color, the light source produced nonwhite light of a plurality of colors other than the first color at energy levels which could not be perceived by the human eye. In the specific embodiment previously referred to in which the nonwhite light which could be perceived by the human eye had a blue color, the plurality of colors at an energy level which could not be perceived by the human eye included green and red light.

The light from the light source was reflected by reflector to obtain white light at an energy level which can be perceived by the human eye. The reflector may have a reflecting surface of a color which is complementary to the nonwhite light of a first color. Thus, in the specific embodiment of the invention previously referred to, the reflector had a yellowish reflecting surface. The reflector attenuates the nonwhite light of the first color (blue) which can be perceived by the human eye and strengthens the plurality of colors (red and green) emitted by the light source at an energy level which can not be perceived by the human eye.

A chromatic shift of light energy reflected from the reflector increases the energy of at least some of the colors of the plurality of colors which were produced by the light source at an energy level which can not be perceived by the human eye. The chromatic shift occurs due to interference of the reflected light with light emanating directly from the light source. The reflector may be constructed so as to be ineffective to reflect light having a wavelength between the wavelengths of the nonwhite light of a first color (blue) and an adjacent color in the spectrum.

BRIEF DESCRIPTION OF THE DRAWINGS

The foregoing and other features of the invention will become more apparent upon a consideration of the following description taken in connection with the accompanying drawings, wherein:

FIG. 2 is an exploded schematic illustration of the display of FIG. 1;

FIG. 3 is a schematic illustration of the relationship between a solid state light source and a reflector in the source of white light used to illuminate the display of FIG. 1;

DESCRIPTION OF ONE SPECIFIC PREFERRED EMBODIMENT OF THE INVENTION

General Description

Figure 1:
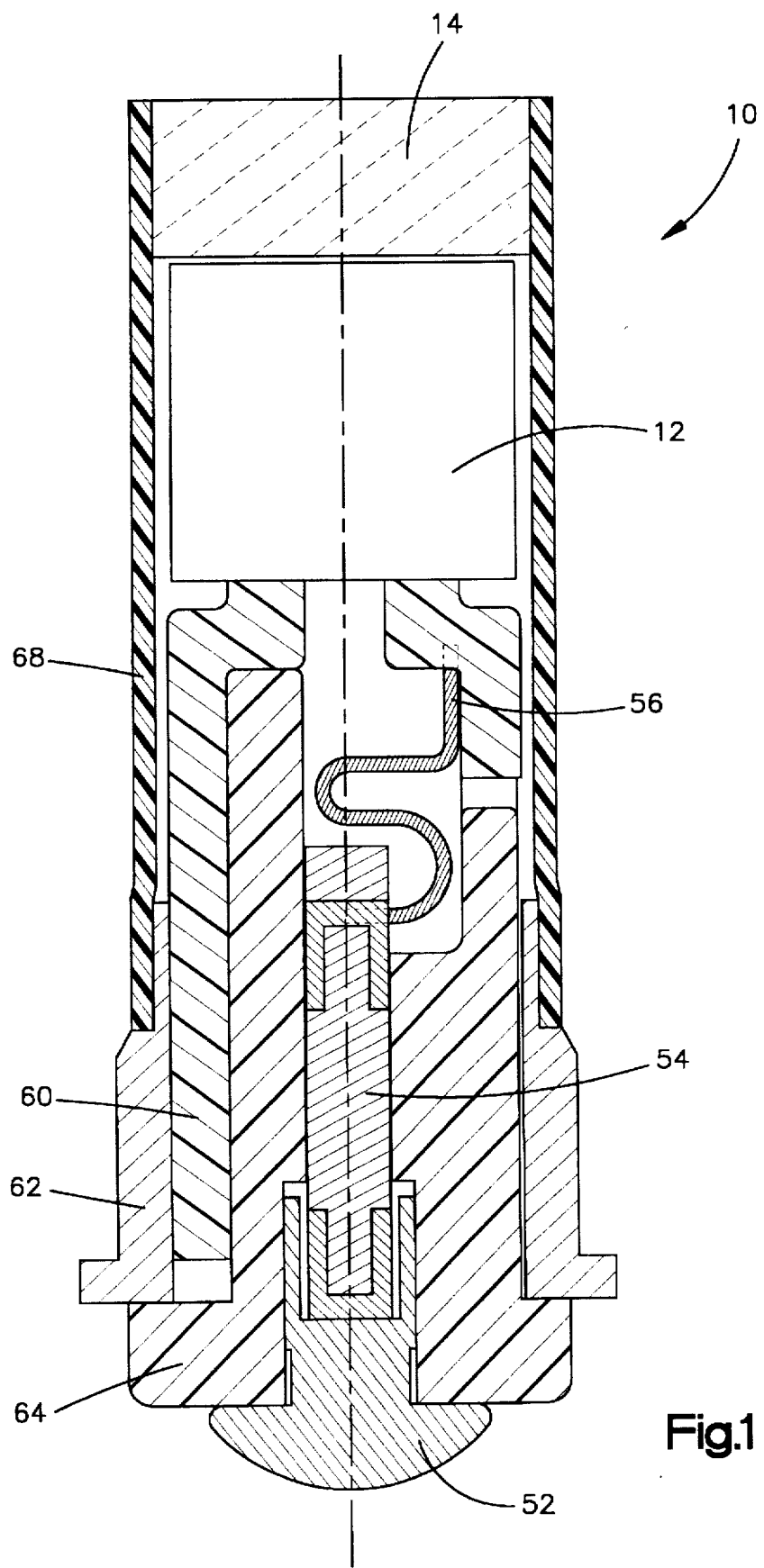
FIG. 1 is a schematic sectional view of a display which is illuminated by a source of white light constructed in accordance with the present invention.

A display assembly 10 (FIGS. 1 and 2) includes an illumination assembly 12 which is constructed and utilized in accordance with the present invention to provide white light. The white light from the illumination assembly 12 illuminates a display lens 14. The white light from the assembly 12 illuminates the display lens 14 and has a color which is very similar to simulated noon sunlight, i.e., white light. Although it is believed that the illumination assembly 12 will be particularly advantageous for use in association with a display such as the display assembly 10, the illumination assembly 12 may be used in association with many different types of devices.

Suitable indicia (not shown) may be provided on the lens 14 or the lens may have a plain surface. Color filters may be associated with the entire lens 14 or a portion of the lens to effect illumination of the lens or a portion of the lens with a hue of a desired color. The display assembly 10 could be used in many different known systems. For example, the display assembly 10 could be an annunciator or a pushbutton-type switch. It is believed that the display assembly 10 may advantageously be utilized in association with an instrument panel of an aircraft or other vehicle. Of course, the display assembly 10 may be used in many different environments other than in association with an aircraft or other vehicle.

The improved illumination assembly 12 is a source of white light. The illumination assembly 12 includes a solid state device or light source 18 (FIG. 3) which emits light of a first or main color at an energy level at which the main color can be perceived by a human eye. In addition, the solid state device 18 emits light of other or secondary colors. However, the light of the secondary colors is at energy levels at which the secondary colors cannot be perceived by a human eye simultaneously with the main color.

The main color and the secondary colors include primary colors. These primary colors are colors by whose additive mixture nearly all other colors may be produced. The primary colors may be many different combinations of colors.

A reflector 22 (FIG. 3) cooperates with the solid state device 18 to attenuate the main color and strengthen the secondary colors emitted by the solid state device. The reflector 22 cooperates with the solid state device 18 to combine the main color and the secondary colors to form white light. The tristimulus values of the light of the main color and the light of the secondary colors are approximately equal in the white light provided by the illumination assembly 12.

The reflector 22 has a reflective surface 26. The solid state device 18 is positioned at a focal point of the reflective surface 26. Some, but not all, of the light emitted by the solid state device 18 is directed toward the reflective surface 26.

The reflective surface 26 has a color which is complementary to the main color of the light emitted by the solid state device or light source 18. The reflective surface 26 may be disposed on a film or layer 30 which is optically porous. When the film or layer 30 is optically porous, a portion of the light from the solid state device 18 is transmitted through the film or layer 30 to an opaque (black) base 32 of the reflector. Of course, the light which is transmitted through the optically porous film or layer 30 to the base 32 is absorbed and is not reflected.

The reflector 22 may advantageously be constructed so that it is ineffective to reflect light of a wavelength between the wavelength of the main color and the wavelength of an adjacent color in the spectrum of color produced by the solid state device 18. This prevents the reflection of light resulting from a shift in the wavelength of the light of a main color with changes in temperature of the solid state device 18.

In addition to attenuating the light of the main color, strengthening the light of the secondary colors, and absorbing some of the light produced by the solid state device 18, the reflector 22 and solid state device cooperate to effect a chromatic shift of light energy reflected from the reflector. This chromatic shift of light energy is obtained by interference between light emitted directly from the solid state device 18 and light reflected from the reflector 22. The interference between the light emitted directly from the solid state device 18 and the light reflected from the reflector 22 increases the energy level of colors in the reflected light other than the main color.

The result is that the solid state device 18 and reflector 22 cooperate to produce white light. Thus, the solid state device 18 produces light which is perceived as having a first or main color to a human eye and cooperates with the reflector 22 to produce white light, indicated at 36 in FIG. 3. The white light 36 is void of any hue and grayness. The white light 36 is formed of primary colors having substantially equal tristimulus values.

Light Source

The solid state device 18 is a source of nonwhite light of a first or main color at an energy level which can be perceived by the human eye. The solid state device 18 is also a source of light of other or secondary colors which cannot be perceived by the human eye simultaneously with perception of the nonwhite light of a main color. Although a different type of solid state device could be utilized, the solid state device 18 is a light-emitting diode. The light-emitting diode forming the solid state device 18 emits light having a spectral energy distribution represented by the curve 40 of FIG. 4.

Figure 4:
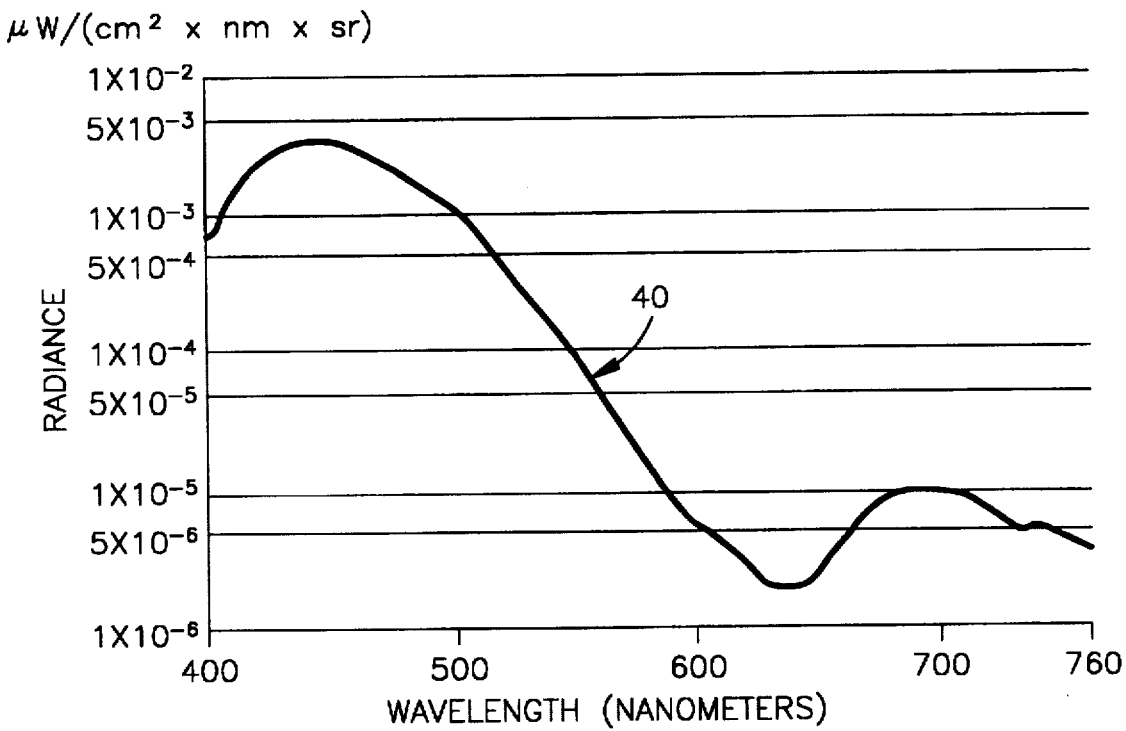
FIG. 4 is a graph illustrating a spectral energy distribution of light obtained from the solid state light source of FIG. 3.

The spectral energy distribution curve 40 of FIG. 4 for the light emitted from the solid state device 18 is a plot of the wavelength of the light in nanometers as the abscissa. The ordinant of the curve 40 is the radiance or energy level of the light in microwatts per square centimeter per nanometer per steradian on a logarithmic scale.

The spectral energy distribution of the light emitted by the solid state device 18 is such that the main color of the light, that is, the color which can be perceived by the human eye, is blue. The blue light emitted by the solid state device 18 has a peak wavelength of approximately 450 nanometers (FIG. 4) with a half spectral bandwidth tolerance of approximately 30 nanometers to 70 nanometers. The light emitted by the solid state device 18 is such that the secondary colors of the light, that is, the colors which cannot be perceived by the human eye, include green, yellow, orange, and red. The secondary colors emitted by the solid state device have a wavelength from approximately 500 to more than 760 nanometers.

The spectral energy distribution of the light emitted by the solid state device 18 (FIG. 4) is such that there is a second order of magnitude separation between the level of energy of the blue light and the level of energy of the green and yellow light. There is a third order of magnitude of separation between the level of energy of the blue light and the level of energy of the orange and red light. Thus, the level of energy of the blue light is more than 10 times the level of energy of the secondary colors of light.

Due to the relatively high level of energy of the blue light emitted by the solid state device 18, the human eye will perceive only the blue light. Thus, the blue light will overpower the green, yellow, orange and red light which is viewed simultaneously with the blue light. Therefore, even though the light source 18 emits light of wavelengths of less than 400 to more than 760 nanometers, the human eye will perceive only the blue light. This results in the light source 18 being referred to as a source of blue light.

The blue light is considered as being light of a color whose hue is that of the portion of the color spectrum lying between green and violet. The green light is considered as being a color whose hue is that of the part of the spectrum lying between blue and yellow. The yellow light is considered as being a color whose hue is that of the portion of the spectrum lying between green and orange. The red light is considered as being of a color whose hue is that of the long-wave extreme of the visible spectrum.

The blue light produced by the light source 18 is considered as being a primary color. The other primary colors produced by the light source 18 are considered as being green and red. The blue, green and red colors are such that they combine to form white light when their tristimulus values are approximately equal. A light source having characteristics different from the characteristics of the light source 18 may have different primary colors.

It is preferred to use a solid state device 18 which produces a light which is perceived as blue by a human eye. Specifically, the solid state device produces blue light in the 400–520 nanometer portion of the visible spectrum. It is preferred to use a solid state device which produces blue light because the blue light has a relatively wide bandwidth to accommodate temperature changes of the solid state device 18.

However, it should be understood that a solid state device which emits a color which is perceived by the human eye and is a color other than blue, could be utilized if desired. Thus, the solid state device 18 could be constructed in such a manner as to emit a green light with a relatively high energy level which is perceived by a human eye and blue and red light which is at a relatively low energy level and cannot be perceived by the human eye simultaneously with perception of the green light. Similarly, a solid state device which is a source of red light which is perceivable by a human eye and blue and green light which is not perceivable may be utilized.

Reflector

A major portion of the light from the solid state device 18 is directed toward the reflector 22. The reflector 22 includes the film or layer 30 which is disposed on the opaque base 32. The film or layer 30 has a reflective surface 26 of a color which is complementary to the color of the perceived light from the solid state device 18.

The light from the solid state device 18 is perceived by a human eye as having a blue color. Therefore, the reflective surface 26 has a yellow color which is complementary to blue. The reflective surface 26 is formed by a thin film or layer of gold which is disposed on the black polymeric base 32. The gold film or layer 30 may be formed by vapor deposition techniques or may be a thin layer which is connected With the base.

The film or layer 30 is very thin and is optically porous. Therefore, a portion of the light from the solid state device passes through the film or layer 30 and is absorbed by the opaque base 32. However, if desired, a reflective film or layer 30 which is not optically porous may be utilized.

The gold film or layer 30 has a yellow reflective surface 26 which is disposed in a wavelength range of 560 to 600 nanometers. The yellow reflective surface 26 of the gold film or layer is a complementary subtractive color to the perceived blue color of the light emitted from the solid state device 18. Although the gold layer 30 has a predominantly yellow color which is perceived by the human eye, there are also very small specks of other colors, including red and green, in the reflective surface 26 formed by the gold film or layer.

Figure 5:
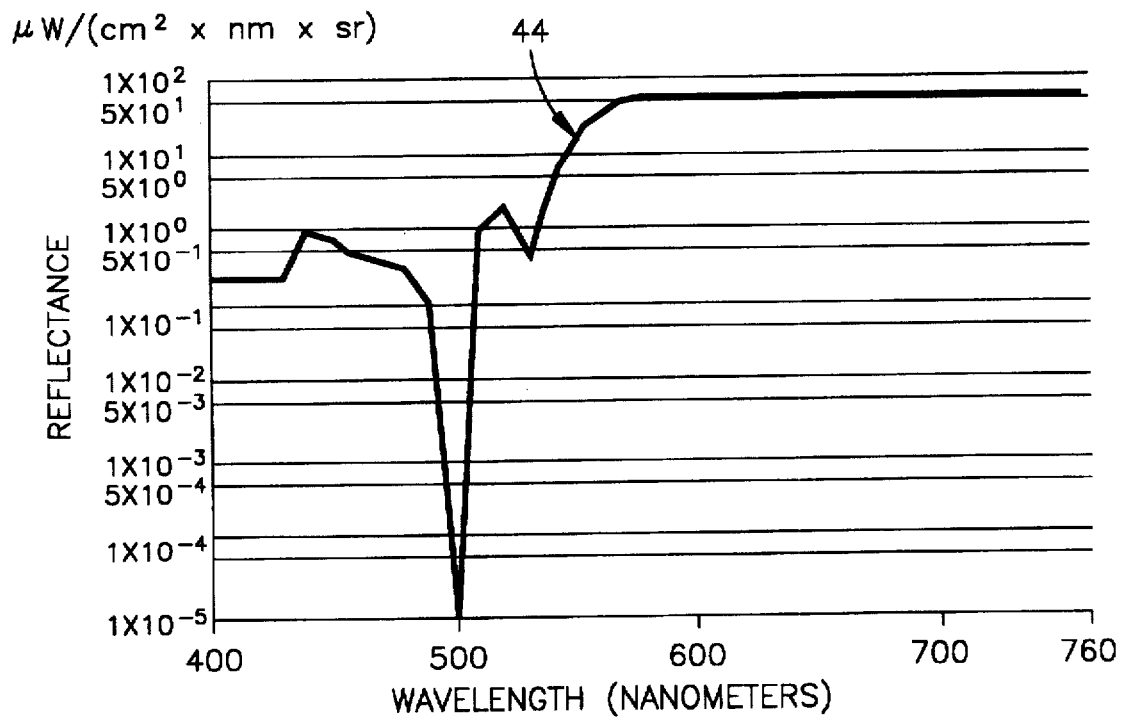
FIG. 5 is a graph illustrating a spectral energy distribution of light reflected from the reflector of FIG. 3 when the reflector is illuminated by a polychromatic light source.

The spectral energy reflection distribution characteristics of the film or layer 30 are depicted by a curve 44 (FIG. 5). The curve 44 depicts the spectral energy of light reflected from the surface 26 when the surface 26 is illuminated by a polychromatic white light source. Thus, when a polychromatic white light source is substituted for the solid state device 18 of FIG. 3, the light reflected from the surface 26 has a spectral energy distribution corresponding to the curve 44.

The curve 44 (FIG. 5) is a plot of the wavelength, in nanometers, of the light reflected from the reflector as the abscissa and the reflectance or energy level of the reflected light in microwatts per square centimeter per nanometer per steradian on a logarithmic scale as the ordinant. The spectral energy distribution curve 44 reveals a low reflectance of light in the 400 to 520 nanometer wavelength region. This results in the perceived color of the reflected polychromatic white light being reddish orange.

The reflective surface 26 attenuates the energy of blue light having a wavelength between 400 and 490 nanometers. Light having a wavelength longer than 540 nanometers has a strengthened energy level. Light having a wavelength between 490 and 510 nanometers is almost completely absorbed by the reflector 22. It should be understood that the spectral energy distribution curve 44 for the light reflected from the reflector 22 is obtained when the reflector is illuminated by a white polychromatic light source, not by light from the solid state device 18.

Figure 6:
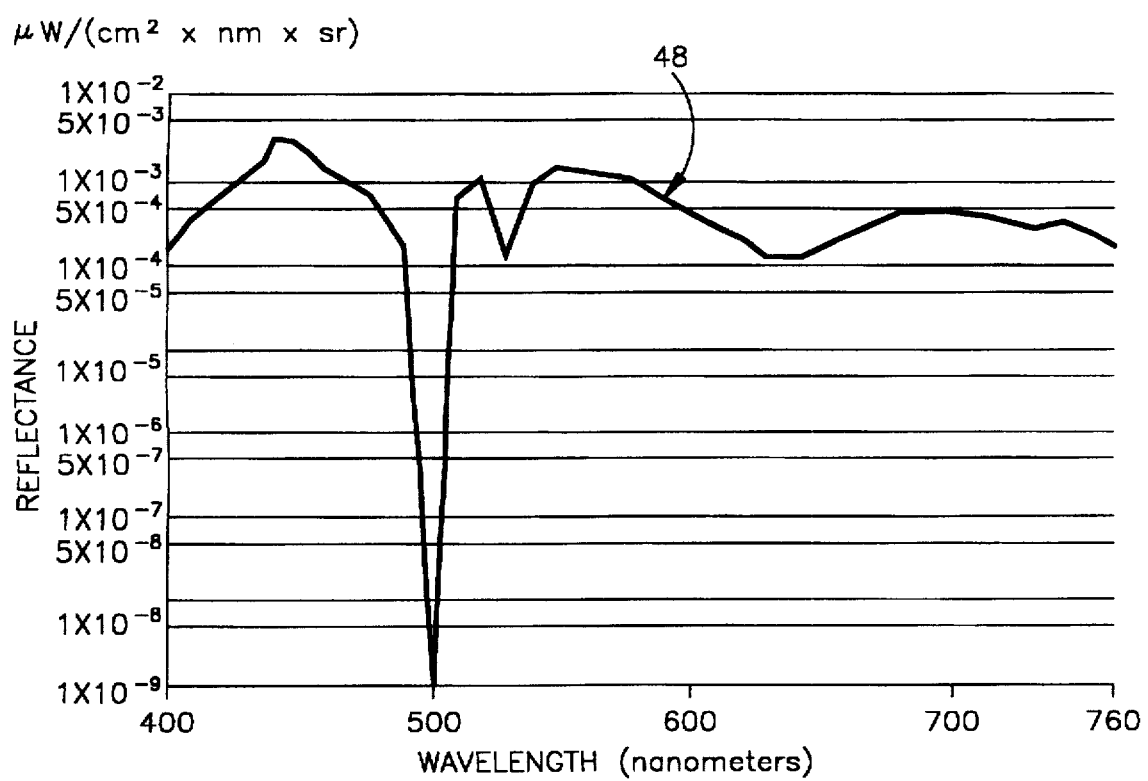
FIG. 6 is a graph illustrating the spectral energy distribution of light from the reflector of FIG. 3 when the reflector is illuminated by light having the spectral energy distribution of FIG. 4.

When the reflective surface 26 is exposed to light from the solid state source 18, the light reflected from the reflector has a spectral energy distribution curve 48 (FIG. 6). The spectral energy distribution curve 48 is in response to illumination of the reflective surface 26 by the light from the solid state device 18. Thus, the blue appearing light from the solid state device 18 which illuminates the reflective surface 26 results in the reflected spectral energy distribution curve 48 of FIG. 6.

The spectral energy distribution curve 48 (FIG. 6) is a plot of the wavelength of light reflected from the reflector 22 with the wavelength of the reflected light in nanometers as the abscissa. The reflectance or energy level of the reflected light in microwatts per square centimeter per nanometer per steradian on a logarithmic scale is the ordinant.

The spectral energy distribution curve 48 (FIG. 6) indicates that no single color is dominant. Thus, the energy level of the various colors in the color spectrum are generally equal. This results in the tristimulus values of the blue, green and red primary colors being approximately equal. Therefore, the human eye perceives the light reflected from the surface 26 as being white or approximately the color of simulated noon sunlight. Thus, the light reflected from the surface 26 when the surface is illuminated by light from the solid state device 18 is perceived by a human eye to be void of hue and grayness.

The light source 18 emits light having the spectral energy distribution of the curve 40 of FIG. 4. Due to the relatively high energy level of the blue wavelength light, the human eye perceives the light emitted by the solid state device 18 as being blue and does not perceive the green and red colors in the light. The reflector 22 attenuates the blue light and strengthens the green and red light. The optically porous film or layer 30 enables a portion of the light from the light source 18 to be absorbed by the reflector. The light reflected from the reflector 22 interferes with blue light which emanates directly from the solid state source 18.

The interference between the blue light which comes directly from the solid state device 18 and the light which is reflected from the surface 26 of the reflector 22 results in a chromatic shift of light energy in the light reflected from the reflector. This chromatic shift of light energy increases the energy of the green and red light while reducing the energy of the blue light.

The white light 36 (FIG. 3) has a spectral energy distribution corresponding to the curve 48 of FIG. 6. The white light 36 is obtained from light which emanates from the solid state device 18 and has a spectral energy distribution corresponding to the curve 40 of FIG. 4. This light is modified by the reflector 22 which absorbs a portion of the light and reflects a major portion of the light. Interference between the light reflected from the reflector 22 and light which emanates directly from the solid state device results in a chromatic shift which further modifies the light from the solid state device 18. The white light which results from a combination of these various effects has the spectral energy distribution illustrated by the curve 48 of FIG. 6.

In one specific instance, the white light 36 at the following tristimulus values when corrected for phototopic function:

$$red(x) = 31.20$$
$$green(y) = 34.90$$
$$blue(z) = \frac{33.08}{99.18} = white$$

The white light 36 had the following chromaticity coordinates (CIE & UCS):

x=0.312
y=0.349 u'=0.1901
v'=0.4786

In this specific instance the light had a correlated color temperature of 6,396 Kelvin. It should be understood that the foregoing specific values for the white light 36 have been set forth herein for purposes of clarity of description and not for purposes of limitation of the invention. It is contemplated that the characteristics of the white light may be different for different embodiments of the invention.

During use of the solid state device 18, the temperature of the solid state device may increase. The increase in temperature of the solid state device may be due to heating at the photo-semiconductor junction, increasing ambient temperature, and/or other causes. The increasing temperature of the solid state device 18 tends to cause the peak wavelength of the light emitted from the solid state device to shift toward a longer wavelength value. Thus, the perceived blue wavelength of the light tends to shift toward the longer green wavelength light with increasing temperature of the solid state device 18.

To prevent shifting of the perceived blue wavelength of the light from the solid state device 18 with increasing temperature of the solid state device, the reflector 22 almost completely absorbs light having a blue/green wavelength. Thus, light having a wavelength of between 490 and 510 nanometers is absorbed by the reflector. This is illustrated by the curve 48 of FIG. 6. Thus light of a wavelength between the perceived blue wavelength of the light from the solid state device 18 and greenish/blue light is not reflected from the surface 26. Therefore, the effect of any tendency for a shift in the wavelength of the perceived light from the solid state device with increases in temperature is minimized.

In the illustrated embodiment of the invention, the solid state device 18 emits light which is perceived by a human eye as being blue. It is contemplated that in other embodiments of the invention, a solid state device which emits light which is perceived by the human eye as having a color other than blue may be used. When this is done, the reflector 22 will be constructed in such a manner as to absorb light of a wavelength between the perceived color of the light from the solid state device and the next adjacent color in the spectrum having a longer wavelength. This will minimize any tendency for the characteristics of the white light 36 to change with changes in temperature of the solid state device.

Display

The reflector 22 and solid state device 18 form a portion of the illumination assembly 12 (FIG. 2). The illumination assembly 12 provides white light to illuminate the lens 14 in the display assembly 10. In the illumination assembly 12, the solid state device 18 and reflector 22 are encapsulated in a polymeric protective material. The polymeric protective material may be optically transparent or translucent.

If desired, suitable colors may be provided in the polymeric material encapsulating the solid state device 18 and reflector 22. In addition, suitable filters may be associated with the white light 36 (FIG. 3) to modify the white light in any desired manner. For example, it is contemplated that suitable filters could be associated with the white light 36 so that a portion of the lens 14 is illuminated with the color red while another portion of the lens is illuminated by the white light.

The solid state device 18 (FIG. 2) in the assembly 12 is energized by electrical energy conducted through a base contact 52 of the display assembly 10 (FIGS. 1 and 2). The electrical energy is conducted from the base contact 52 through a chip resistor 54 to a contact spring 56. The electrical energy is conducted from the contact spring 56 to the solid state device 18 in the assembly 12.

An opposite polarity-terminal 60 is connected with a contact flange 62 of the display assembly 10. The contact flange 62 of the display assembly 10 is electrically insulated from the base contact 52 and the contact spring 56 by a generally cylindrical base insulator 64. A cylindrical insulating sleeve 68 encloses the lens 14 and illumination assembly 12 (FIG. 1).

Although the illumination assembly 12, which is a source of white light has been described herein as being utilized in the display assembly 10, it is contemplated that the illumination assembly 12 could be mounted directly on a printed circuit board or directly on an instrument panel. Regardless of where the illumination assembly 12 is mounted, it will provide white light. The specific purpose of the display will vary variations in the environment in which the illumination assembly 12 is utilized as a source of white light.

It should be understood that it is not intended to limit the present invention to the use of the illumination assembly 12 in association with any particular type apparatus. However, it is believed that the illumination assembly 12 may advantageously be utilized in association with indication lights and controls to provide illumination stability and color consistency that support key human recognitive functions. Thus, the illumination assembly 12 may be utilized as a source of white light in air traffic control equipment, medical diagnostic systems, or aircraft.

Conclusion

In view of the foregoing description, it is apparent that the present invention provides a new and improved method and apparatus for use in providing illumination. The illumination may, for example, be for a display 10, such as an annunciator or a pushbutton of a switch. The display 10 may be provided on a control panel or may be in a different environment. Of course, the illumination may be for other purposes.

To provide the illumination, a light source 18 is energized to produce nonwhite light of a first color at an energy level which can be perceived by a human eye. In one specific embodiment of the invention, the light source 18 was a sold state light source which was energized to produce blue light at an energy level at which the blue light could be perceived by a human eye. In addition to the nonwhite light of a first color, the light source produced nonwhite light of a plurality of colors other than the first color at energy levels which could not be perceived by the human eye. In the specific embodiment previously referred to in which the nonwhite light which could be perceived by the human eye had a blue color, the plurality of colors at an energy level which could not be perceived by the human eye included green and red light.

The light from the light source 18 was reflected by reflector 22 to obtain white light 36 at an energy level which can be perceived by-the human eye. The reflector 22 may have a reflecting surface 26 of a color which is complementary to the nonwhite light of a first color. Thus, in the specific embodiment of the invention previously referred to, the reflector had a yellowish reflecting surface 26. The reflector 22 attenuates the nonwhite light of the first color (blue) which can be perceived by the human eye and strengthens the plurality of colors (red and green) emitted by the light source at an energy level which can not be perceived by the human eye.

A chromatic shift of light energy reflected from the reflector 22 increases the energy of at least some of the colors of the plurality of colors which were produced by the light source at an energy level which can not be perceived by the human eye. The chromatic shift occurs due to interference of the reflected light with light emanating 22 directly from the light source 18. The reflector may be constructed so as to be ineffective to reflect light having a wavelength between the wavelengths of the nonwhite light of a first color (blue) and an adjacent color in the spectrum.

Having described the invention, the following is claimed:

1. A method of providing illumination, said method comprising the steps of energizing a light source to produce nonwhite light of a first color at an energy level which can be perceived by the human eye, and obtaining white light at an energy level which can be perceived by a human eye by reflecting the nonwhite light of a first color from a reflector.

2. A method as set forth in claim 1 wherein said step of energizing a light source to produce nonwhite light of a first color includes energizing a light emitting diode to produce blue light at a first energy level at which the blue light can be perceived by a human eye and green and red light at energy levels which are lower than the first energy level and which can not be perceived by a human eye simultaneously with perception of the blue light.

3. A method as set forth in claim 1 wherein said step of obtaining white light by reflecting the light of a first color includes reflecting the light of a first color from a surface having a color which is complementary to the first color.

4. A method as set forth in claim 1 wherein said step of energizing a light source to produce nonwhite light of a first color includes producing light energy at least a portion of which is in a wavelength range of 420 nanometers to 490 nanometers, said step of reflecting the nonwhite light of a first color includes reflecting the light of a first color from a reflector having a surface of a color within a wavelength range of 560 nanometers to 600 nanometers.

5. A method as set forth in claim 1 wherein said step of energizing a light source to produce nonwhite light of a first color also includes producing light of a plurality of colors other than said first color at an energy level which can not be perceived by the human eye, said step of obtaining white light includes effecting a chromatic shift of light energy reflected from the reflector to increase the energy of at least some of the colors of the plurality of colors.

6. A method as set forth in claim 5 wherein said step of effecting a chromatic shift of wavelength of light reflected from the reflector is at least partially performed under the influence of interference between light waves moving from the light source with light waves moving from the reflector.

7. A method of providing illumination, said method comprising the steps of energizing a solid state light source to produce light containing at least a first primary color at an energy level which can be perceived by a human eye and second and third primary colors at energy levels which can not be perceived by a human eye simultaneously with perception of the light of the first primary color and changing the light from the light source to white light at an energy level which can be perceived by a human eye and is formed by a combination of light of different colors from the light source, said step of changing the light from the light source to white light includes effecting an increase in the energy levels of at least the light of the second and third primary colors to energy levels which can be perceived by a human eye.

8. A method as set forth in claim 7 wherein the light of a first primary color is blue and the light of the second and third primary colors are green and red, the blue light being produced by the solid state light source having an energy level which is at least ten times as great as the energy level at which the red light is produced by the solid state light source.

9. A method as set forth in claim 8 wherein said step of changing the light from the light source to white light at an energy level which can be perceived by a human eye includes reflecting the blue light from a reflector having a surface which has a complementary color to the blue light.

10. A method as set forth in claim 7 wherein said step of changing the light from the light source to white light by effecting an increase in the energy levels of the light of the second and third primary colors includes reflecting the light from the light source from a reflector and having interference between light reflected from the reflector and light which is emitted directly from the light source.

11. A method as set forth in claim 10 wherein said step of reflecting the light from a reflector includes reflecting the light from a surface which has a color which is complementary to the first primary color.

12. A method as set forth in claim 10 wherein said step of reflecting the light from the light source from a reflector includes reflecting the light from a reflector which is ineffective to reflect light of a wavelength which is between wavelengths of the light of a first primary color and the light of a second primary color.

13. A method of providing illumination, said method comprising the steps of energizing a light source to produce nonwhite light of a first color at an energy level which can be perceived by the human eye, said step of energizing a light source to produce nonwhite light of a first color includes energizing a light emitting diode to produce blue light at a first energy level at which the blue light can be perceived by a human eye and green and red light at energy levels which are lower than the first energy level and which can not be perceived by a human eye simultaneously with perception of the blue light, and obtaining white light at an energy level which can be perceived by a human eye by reflecting the nonwhite light of a first color from a reflector, said step of obtaining white light includes absorbing a portion of the energy of the blue light at the reflector, reflecting a portion of the blue light from the reflector, reflecting the green and red light from the reflector, and combining the blue, green and red light to form white light at an energy level which can be perceived by the human eye.

14. A method as set forth in claim 13 further including the step of increasing the wavelength of a portion of the blue light produced by the light emitting diode and absorbing light energy of the increased wavelength with the reflector.

15. A method of providing illumination, said method comprising the steps of energizing a light source to produce nonwhite light of a first color at an energy level which can be perceived by the human eye, said step of energizing a light source to produce nonwhite light of a first color includes energizing a solid state device to produce nonwhite light which increases in wavelength as the temperature of at least a portion of the light source increases, and obtaining white light at an energy level which can be perceived by a human eye by reflecting the nonwhite light of a first color from a reflector, said step of reflecting the light of a first color from a reflector includes absorbing a portion of the nonwhite light at the reflector and increasing the rate at which the nonwhite light is absorbed at the reflector as the wavelength of the nonwhite light increases.

16. A method as set forth in claim 15 wherein said step of energizing a solid state device to produce nonwhite light includes energizing a light emitting diode to produce blue light at a first energy level at which the blue light can be perceived by a human eye and green and red light at energy levels which are lower than the first energy level and which can not be perceived by a human eye simultaneously with perception of the blue light.

17. A method as set forth in claim 16 wherein said step of obtaining white light includes absorbing a portion of the energy of the blue light at the reflector, reflecting a portion of the blue light from the reflector, reflecting the green and red light from the reflector, and combining the blue, green and red light to form white light at an energy level which can be perceived by the human eye.

18. A method as set forth in claim 15 wherein said step of obtaining white light by reflecting the light of a first color includes reflecting the light of a first color from a surface having a color which is complementary to the first color.

19. A method as set forth in claim 15 wherein said step of energizing a light source to produce nonwhite light of a first color includes producing light energy at least a portion of which is in a wavelength range of 420 nanometers to 490 nanometers, said step of reflecting the nonwhite light of a first color includes reflecting the light of a first color from a reflector having a surface of a color within a wavelength range of 560 nanometers to 600 nanometers.

20. A method as set forth in claim 15 wherein said step of energizing a light source to produce nonwhite light of a first color includes energizing a solid state device to produce nonwhite light in a first primary color wavelength range, said step of reflecting light of a first color from a reflector includes reflecting the nonwhite light of a first primary color from a surface which absorbs a portion of the nonwhite light of a first primary color and which has a color which is complementary to the primary color of the nonwhite light of a first primary color.

21. A method as set forth in claim 15 wherein said step of energizing a light source to produce nonwhite light of a first color also includes producing light of a plurality of colors other than said first color at an energy level which can not be perceived by the human eye, said step of obtaining white light includes effecting a chromatic shift of light energy reflected from the reflector to increase the energy of at least some of the colors of the plurality of colors.

22. A method as set forth in claim 24 wherein said step of effecting a chromatic shift of wavelength of light reflected from the reflector is at least partially performed under the influence of interference between light waves moving from the light source with light waves moving from the reflector.

23. A method of providing illumination, said method comprising the steps of energizing a light source to produce nonwhite light of a first color at an energy level which can be perceived by the human eye, said step of energizing a light source to produce nonwhite light of a first color includes energizing a solid state device to produce nonwhite light in a first primary color wavelength range, and obtaining white light at an energy level which can be perceived by a human eye by reflecting the nonwhite light of a first color from a reflector, said step of reflecting light of a first color from a reflector includes reflecting the nonwhite light of a first primary color from a surface which absorbs a portion of the nonwhite light of a first primary color and which has a color which is complementary to the primary color of the nonwhite light of a first primary color.

24. A method as set forth in claim 23 wherein said step of energizing a solid state device to produce nonwhite light in a first primary color wavelength range includes producing blue light at a first energy level at which the blue light can be perceived by a human eye and green and red light at energy levels which are lower than the first energy level and which can not be perceived by a human eye simultaneously with perception of the blue light.

25. A method as set forth in claim 24 wherein said step of obtaining white light includes absorbing a portion of the energy of the blue light at the reflector, reflecting a portion of the blue light from the reflector, reflecting the green and red light from the reflector, and combining the blue, green and red light to form white light at an energy level which can be perceived by the human eye.

26. A method as set forth in claim 25 further including the step of increasing the wavelength of a portion of the blue light produced by the light emitting diode and absorbing light energy of the increased wavelength with the reflector.

27. A method as set forth in claim 23 wherein said step of energizing a solid state device to produce nonwhite light in a first primary color wavelength range includes producing light energy at least a portion of which is in a wavelength range of 420 nanometers to 490 nanometers, said step of reflecting the nonwhite light of a first primary color includes reflecting the light of a first primary color from a reflector having a surface of a color within a wavelength range of 560 nanometers to 600 nanometers.

28. A method as set forth in claim 23 wherein said step of energizing a solid state to produce nonwhite light in a first primary color wavelength range also includes producing light of a plurality of colors other than said first primary color at an energy level which can not be perceived by the human eye, said step of obtaining white light includes effecting a chromatic shift of light energy reflected from the reflector to increase the energy of at least some of the colors of the plurality of colors.

29. A method of providing illumination, said method comprising the steps of producing light containing at least a first primary color at an energy level which can be perceived by a human eye and second and third primary colors at energy levels which can not be perceived by a human eye simultaneously with perception of the light of the first primary color by energizing a light source, and changing the light from the light source to white light at an energy level which can be perceived by a human eye and is formed by a combination of light of different colors from the light source, said step of changing the light from the light source to white light includes effecting an increase in the energy levels of at least the light of the second and third primary colors to energy levels which can be perceived by a human eye by reflecting the light from the light source from a reflector having a surface of a color which is complementary to the first primary color.

30. A method as set forth in claim 29 wherein the light of a first primary color is blue and the light of the second and third primary colors are green and red, the blue light being produced by the light source at an energy level which is at least ten times as great as the energy level at which the red light is produced by the light source.

31. A method as set forth in claim 30 wherein said step of changing the light from the light source to white light at an energy level which can be perceived by a human eye includes reflecting the blue light from a reflector having a surface which has a complementary color to the blue light.

32. A method as set forth in claim 29 wherein said step of reflecting the light from the light source from a reflector includes establishing interference between light reflected from the reflector and light which is emitted directly from the light source.

33. A method as set forth in claim 29 wherein said step of reflecting the light from the light source from a reflector includes reflecting the light from a reflector which is ineffective to reflect light of a wavelength which is between wavelengths of the light of a first primary color and the light of a second primary color.

34. A method of providing illumination, said method comprising the steps of energizing a light source to produce nonwhite light of a first color at an energy level which can be perceived by the human eye, said step of energizing a light source to produce nonwhite light of a first color includes producing light of a first color at a first energy level at which the light of a first color can be perceived by a human eye and light of second and third colors at energy levels which are lower than the first energy level and which can not be perceived by a human eye simultaneously with perception of the light of a first color, and obtaining white light at an energy level which can be perceived by a human eye by reflecting the nonwhite light of a first color from a reflector, said step of obtaining white light includes absorbing a portion of the energy of the light of a first color at the reflector, reflecting a portion of the light of a first color from the reflector, reflecting the light of the second and third colors from the reflector, and combining the light of the first, second and third colors to form white light at an energy level which can be perceived by the human eye.

35. A method as set forth in claim 34 further including the step of increasing the wavelength of a portion of the light of a first color produced by the light source and absorbing light energy of the increased wavelength with the reflector.

36. A method as set forth in claim 34 wherein said step of reflecting the light of a first color from a reflector includes reflecting the light from a surface having a color which is complementary to the first color.

37. A method as set forth in claim 34 wherein said step of energizing a light source to produce nonwhite light of a first color includes producing light energy at least a portion of which is in a wavelength range of 420 nanometers to 490 nanometers, said step of reflecting the nonwhite light of a first color includes reflecting the light of a first color from a reflector having a surface of a color within a wavelength range of 560 nanometers to 600 nanometers.

38. A method of providing illumination, said method comprising the steps of energizing a light source to produce nonwhite light of a first color at an energy level which can be perceived by the human eye, said step of energizing a light source to produce nonwhite light of a first color also includes producing light of a plurality of colors other than said first color at an energy level which can not be perceived by the human eye, and obtaining white light at an energy level which can be perceived by a human eye by reflecting the nonwhite light of a first color and the light of a plurality of colors other than the first color from the reflector and effecting a chromatic shift of light energy reflected from the reflector to increase the energy of light of at least some of the colors.

39. A method as set forth in claim 38 wherein said step of effecting a chromatic shift of light energy reflected from the reflector is at least partially performed under the influence of interference between light waves moving from the light source with light waves moving from the reflector.

40. An apparatus comprising a solid state device which is energizeable to produce blue light which is perceivable by a human eye and red and green light which is not perceivable by a human eye simultaneously with perception of the blue light, and a reflector having a reflective surface which is formed of material having a yellowish color from which the light from the light source is reflected as white light.

41. An apparatus as set forth in claim 40 wherein said reflector is constructed so as to be ineffective to reflect light having a wavelength between the wavelengths of blue light and green light.

* * * * *

UNITED STATES PATENT AND TRADEMARK OFFICE
CERTIFICATE OF CORRECTION

PATENT NO.   : 5 743 629
DATED        : April 28, 1998
INVENTOR(S)  : Robert P. Helstern and Yusuke P. Okabayashi It is certified that error appears in the above-indentified patent and that said Letters Patent is hereby corrected as shown below:

Column 11, line 36, change "24" to --21--.

Signed and Sealed this

Fifteenth Day of September, 1998

Attest:

BRUCE LEHMAN

Attesting Officer        Commissioner of Patents and Trademarks